(12) United States Patent
Fujiyama et al.

(10) Patent No.: US 7,688,059 B2
(45) Date of Patent: Mar. 30, 2010

(54) FILTER CHARACTERISTIC ADJUSTING APPARATUS AND FILTER CHARACTERISTIC ADJUSTING METHOD

(75) Inventors: Hirokuni Fujiyama, Hyogo (JP); Takashi Morie, Osaka (JP); Hiroya Ueno, Osaka (JP)

(73) Assignee: Panasonic Corporation, Osaka (JP)

( * ) Notice: Subject to any disclaimer, the term of this patent is extended or adjusted under 35 U.S.C. 154(b) by 243 days.

(21) Appl. No.: 11/792,946

(22) PCT Filed: Nov. 29, 2005

(86) PCT No.: PCT/JP2005/021889

§ 371 (c)(1),
(2), (4) Date: Jun. 13, 2007

(87) PCT Pub. No.: WO2006/064658

PCT Pub. Date: Jun. 22, 2006

(65) Prior Publication Data

US 2008/0218255 A1    Sep. 11, 2008

(30) Foreign Application Priority Data

Dec. 13, 2004    (JP) .............................. 2004-360462

(51) Int. Cl.
*G01R 23/165* (2006.01)
(52) U.S. Cl. .................... 324/76.68; 333/207; 455/340; 327/553
(58) Field of Classification Search ............... 324/76.68
See application file for complete search history.

(56) References Cited

U.S. PATENT DOCUMENTS

| | | | | |
|---|---|---|---|---|
| 4,417,220 A | * | 11/1983 | Holyman et al. ............ | 333/174 |
| 5,227,748 A | * | 7/1993 | Sroka .......................... | 333/207 |
| 5,783,977 A | * | 7/1998 | Chethik ...................... | 333/174 |
| 6,134,282 A | * | 10/2000 | Ben-Efraim et al. ........ | 375/350 |
| 6,262,624 B1 | * | 7/2001 | Tsinker ....................... | 327/553 |
| 7,002,427 B2 | * | 2/2006 | Nystrom et al. ............ | 333/17.1 |
| 7,429,889 B2 | * | 9/2008 | Kasperkovitz .............. | 327/552 |

(Continued)

FOREIGN PATENT DOCUMENTS

JP    6-209231    7/1994

(Continued)

OTHER PUBLICATIONS

Tan, K. et al, "Fully Integrated Analog Filters Using Bipolar-JFET Technology," IEEE Journal of Solid-State Circuits, vol. SC-13, No. 6, Dec. 1978, pp. 814-821.

*Primary Examiner*—Timothy J Dole
*Assistant Examiner*—Benjamin M Baldridge
(74) *Attorney, Agent, or Firm*—Steptoe & Johnson LLP

(57) ABSTRACT

There is provided a filter characteristic adjusting apparatus and a filter characteristic adjusting method which can avoid an increase in circuit scale of the filter characteristic adjusting apparatus, and can speedily adjust a characteristic frequency of the filter to a desired frequency. When performing characteristic adjustment for the filter, the test signal generation unit (31) generates a test signal (s14) which is a pulse signal having the same frequency as the characteristic frequency of the filter (10) on the basis of a reference signal (s17), and a phase-shifted test signal (s14') that is obtained by shifting the phase of the test signal (s14) by a predetermined amount with a phase shift unit (32) in a control signal generation unit (33) is compared with a filter output signal (s16) that is obtained by inputting the test signal (s14) into the filter (10) to obtain a phase difference between the signals, and then the phase difference is subjected to a binary search to generate a control signal (s11).

7 Claims, 16 Drawing Sheets

U.S. PATENT DOCUMENTS

| | | | |
|---|---|---|---|
| 2001/0054929 A1 | 12/2001 | Yamazaki | 327/552 |
| 2002/0132598 A1* | 9/2002 | Saito | 455/183.1 |
| 2002/0190810 A1* | 12/2002 | Nystrom et al. | 333/17.1 |
| 2003/0048130 A1* | 3/2003 | Isoda | 327/553 |
| 2003/0207679 A1* | 11/2003 | Kaczynski et al. | 455/339 |
| 2004/0017871 A1* | 1/2004 | Christensen et al. | 375/373 |
| 2005/0232080 A1* | 10/2005 | Tolciu | 367/99 |

FOREIGN PATENT DOCUMENTS

| | | |
|---|---|---|
| JP | 10-242821 | 9/1998 |
| JP | 2002-111492 | 4/2002 |
| JP | 2003-124784 | 4/2003 |
| JP | 2003-188683 | 7/2003 |

* cited by examiner

Fig.9

$$\text{Step0}: \quad C_0 = \overbrace{1000\cdots000}^{n\text{ bit}} \leftarrow \text{initial value}$$
$$\text{Step1}: \quad C_1 = *100\cdots000$$
$$\text{Step2}: \quad C_2 = **10\cdots000$$
$$\text{Step3}: \quad C_3 = ***1\cdots000$$
$$\text{Step4}: \quad C_4 = ****\cdots000$$

$$\wr$$

$$\text{Step}(n-3): \quad C_{n-3} = ****\cdots100$$
$$\text{Step}(n-2): \quad C_{n-2} = ****\cdots*10$$
$$\text{Step}(n-1): \quad C_{n-1} = **\cdots1$$
$$\text{Step}(n): \quad C_n = **\cdots* \leftarrow \text{control register value}$$

FILTER CHARACTERISTIC ADJUSTING APPARATUS AND FILTER CHARACTERISTIC ADJUSTING METHOD

The present application is based on International Application PCT/JP2005/021889, filed Nov. 29, 2005, which claims priority to Japanese Patent Application No. 2004-360462, filed Dec. 13, 2004, the entire contents of which are hereby incorporated by reference.

TECHNICAL FIELD

The present invention relates to a characteristic adjusting apparatus for adjusting a characteristic frequency of a filter, and a characteristic adjusting method thereof.

BACKGROUND ART

A filter is often constituted by a MOSFET-C filter or a Gm-C filter. The reason is that the MOSFET-C filter and the Gm-C filter are filters using no operational amplifiers and therefore speeding up can be achieved.

In the above-mentioned analog filter, however, there exists a problem that the filter characteristic might be degraded due to variations in element values constituting the filter, or variations in temperature. For example, in a case of a low-pass filter, a cutoff frequency as a characteristic frequency of this filter has an error between its design value and its actual value. In order to resolve this error, conventionally, a PLL circuit including a voltage-controlled oscillator (hereinafter referred to as a VCO) is provided in a device having a filter, in addition to the filter, and the filter characteristic is adjusted by a so-called master/slave system using the PLL circuit (for example, refer to Non-Patent Document 1: "K. Tan and P. R. Gray, Fully Integrated Analog Filters Using Bipolar-JFET Technology, IEEE JSSC, December 1978"), or the characteristic of the filter is adjusted using the filter itself that is used for actual operation (for example, refer to Patent Document 1: Japanese Published Patent Application No. 2000-59162 (Pages 4-7, FIG. 1)).

Hereinafter, the conventional filter characteristic adjusting method will be described.

In a conventional master/slave system filter characteristic adjusting apparatus 300, a filter 10 is placed on the slave side, and a VCO 61 included in a PLL circuit 60 is placed on the master side, as shown in FIG. 15. The PLL circuit 60 on the master side comprises a VCO 61 which oscillates based on a reference clock s62, an oscillation frequency measurement unit 62 which measures a frequency of an oscillation signal s64 that is outputted from the VCO 61, and a control unit 63 which generates a control signal S61 for controlling the filter 10 on the basis of an output signal from the oscillation frequency measurement unit 62. It is assumed that the oscillation frequency of the VCO 61 and the characteristic frequency of the filter 10 are proportional to each other. In the filter characteristic adjusting apparatus 300 having such construction, in the PLL circuit 60 on the master side, the oscillation waveform s64 of the VCO 61 is input to the oscillation frequency measurement unit 62, and the control unit 63 generates a control signal s61 for controlling the characteristic frequency of the filter 10 on the basis of the information of the frequency that is measured in the measurement unit 62, and the GM values of the VCO 61 and the filter 10 are controlled with the control signal s61, thereby realizing automatic adjustment for the frequency characteristic of the filter 10 (for example, refer to the Non-Patent Document 1).

Further, a conventional filter characteristic adjusting apparatus 400 using a filter itself which is used for normal operation comprises, as shown in FIG. 16, a step signal generation unit 77 for generating a step signal s74 to be used for a tuning operation of the filter 10, a signal selection unit 71 for selecting a signal to be inputted to the filter 10 on the basis of a selection signal s72, a response waveform period measurement unit 74 for counting a filter output signal s76 outputted from the filter 10 to measure a frequency of the filter 10, and a control unit 78 for generating a characteristic frequency control signal s71 that controls a measurement signal s78 outputted from the response waveform period measurement unit 74 so as to be within the range of the reference frequency. Since the filter 10 is used for both the normal operation and the tuning operation, in the filter characteristic adjusting apparatus 400, the signal selection unit 71 selects a normal signal s73 as an input signal during the normal operation of the filter 10, and inputs this signal to the filter 10, whereby the filter 10 outputs a filter output signal s76 that is a response waveform to the filter input signal s75. On the other hand, during the tuning operation of the filter 10, the step signal s74 is directly input to the filter 10, and the period of the response waveform of the filter 10 to the step signal s74 is measured by the response waveform period measurement unit 74, and the characteristic frequency of the filter 10 is automatically adjusted to a desired frequency by the control unit 78 (for example, refer to the Patent Document 1).

DISCLOSURE OF THE INVENTION

Problems to be Solved by the Invention

In the case of the above-mentioned master/slave system, however, the order of the usually adopted VCO 61 is the second order, and the order of the filter 10 as the other control target is higher than the second order in many cases. FIG. 17 is a diagram illustrating the frequency characteristics of a low-pass filter and a VCO having different orders. As shown in FIG. 17, the VCO also has the characteristic of the low-pass filter. The VCO 61 of the relatively low order has slower falling of gain in the vicinity of the cutoff frequency as compared with the low-pass filter of the relatively higher order, and the phase characteristic of the filter of the relatively low order changes slower than that of the filter of the relatively high order.

Accordingly, after tuning of the filter 10 is performed in the mater/slave system characteristic adjusting apparatus 300, if the control signal s61 for controlling the characteristic frequency of the filter somewhat deviates from an optimum point and thereby a phase error ΔP1 occurs in the VCO 61, a phase error ΔP2 larger than the phase error ΔP1 occurs in the filter 10 as shown in FIG. 18, and consequently, the characteristic frequency of the filter undesirably deviates.

Therefore, in the master/slave system, a special circuit for correcting the above-mentioned error is required for suppressing the deviation of the filter characteristic from the optimum tuning state, which deviation is caused by the relative variation between the filter 10 and the VCO 61, resulting in an increase in the circuit scale.

Further, the master/slave system also as a problem that the design correlation between the characteristic frequency of the filter 10 and the oscillation frequency of the VCO 61 is different from the actual correlation.

On the other hand, in the conventional method using the filter 10 directly for tuning, when measuring the frequency of the filter 10 by the response waveform period measurement unit 74, a sampling frequency higher than the characteristic frequency of the filter 10 is required.

Further, in the frequency measurement for the filter 10 by the response waveform period measurement unit 74, the response waveform from the filter 10 to the step signal s74 is compared with the reference level by a comparator that is not shown, and a period of rising transition or falling transition of the output waveform from the comparator is measured. However, since the gain characteristic of the pass band significantly varies depending on the order of the filter as a target of characteristic adjustment, the comparator cannot perform accurate comparison, leading to a problem that an adjustment error might occur. In order to avoid such adjustment error, an adjustment means for adjusting the error is additionally required, resulting in an increase in the circuit scale.

Further, in the conventional method, until the characteristic frequency of the filter 10 falls within a desired frequency error range, the step signal s74 is repeatedly generated and inputted to the filter 10 while changing the value of the control signal, and the filter output signal s76 from the filter 10 is repeatedly measured by the response waveform period measurement unit 74 to judge the error, and therefore, the filter adjustment takes a long time.

The present invention is made to solve the above-described problems and has for its object to provide a filter characteristic adjusting apparatus and a characteristic adjusting method thereof, which can avoid an increase in the circuit scale of the filter characteristic adjusting apparatus, i.e., an increase in the circuit area, and adjust the characteristic frequency of the filter to a desired frequency at higher speed.

Measures to Solve the Problems

In order to solve the above-mentioned problems, a filter characteristic adjusting apparatus of the present invention comprises: a test signal generation unit for receiving a reference signal, and generating a test signal to be supplied to a filter when adjusting a frequency characteristic of the filter; a phase shift unit for phase-shifting the test signal generated by the test signal generation unit so that a predetermined phase difference is generated between the phase of the test signal and the phase of an ideal filter output signal that is to be obtained when the test signal is inputted to the filter, on the basis of a phase characteristic of the filter and a frequency of the test signal; and a control signal generation unit for generating a control signal which controls a characteristic frequency of the filter by using the filter output signal that is obtained when the test signal is inputted to the filter and the test signal that is phase-shifted by the phase shift unit.

Thereby, when performing characteristic adjustment for the above-mentioned filter, a filter output signal is detected at the timing of rising or falling of a signal that is obtained by phase-shifting the test signal generated in the test signal generation unit, and a control signal for controlling the frequency characteristic of the filter is generated on the basis of the result of the detection. Therefore, characteristic adjustment for the filter can be carried out in a short time, and the construction of the filter characteristic adjusting apparatus is simplified, and further, the circuit area thereof is reduced.

According to the present invention, in the filter characteristic adjusting apparatus the phase shift unit shifts the phase of the test signal so that the phase difference between the test signal and the ideal filter output signal becomes 180°.

Thereby, a control signal for controlling the characteristic frequency of the filter can be detected by a binary search, and the characteristic adjustment for the filter can be carried out in a short time.

According to the present invention, in the filter characteristic adjusting apparatus, the control signal generation unit comprises: a first comparator for comparing the filter output signal with a reference signal; a second comparator for comparing an output signal from the phase shift unit with the reference signal; a phase comparator for comparing the phases of binary signals that are respectively outputted from the first and second comparators; and a logic unit for generating the control signal by using the output from the phase comparator and the output from the second comparator.

Thereby, a control signal for controlling the frequency characteristic of the filter can be generated on the basis of the result of phase comparison performed between the signal that is obtained by phase-shifting the test signal and the filter output signal from the filter, and therefore, the construction of the filter characteristic adjusting apparatus can be simplified and reduced.

According to the present invention, in the filter characteristic adjusting apparatus, the logic unit comprises: a binary search unit for receiving an output from the phase comparator and an output from the second comparator, and performing a binary search for a result of comparison from the phase comparator at a timing of a rising edge or a falling edge of the output from the second comparator; and a control signal determination unit for generating the control signal on the basis of a value that is obtained by the binary search unit.

Thereby, the control signal can be obtained by a binary search, and the characteristic adjustment for the filter can be carried out in a short time.

According to the present invention, in the filter characteristic adjusting apparatus, the test signal is a pulse signal.

Thereby, since the phase difference of the filter can be continuously measured, the characteristic adjustment process can be carried out in a short time.

According to the present invention, in the filter characteristic adjusting apparatus, the test signal has a frequency equal to a cutoff frequency in an ideal state of the filter.

Thereby, setting of a phase shift amount of the filter is facilitated.

According to the present invention, the filter characteristic adjusting apparatus further includes a signal selection unit, which is provided in front of the filter, for receiving the test signal and an input signal to be a processing target during normal operation, and selecting the test signal when the characteristic adjustment for the filter is performed, while selecting the input signal when the normal operation is performed.

Thereby, the same filter can be used for the normal operation of the filter and the tuning operation thereof, and further, a tuning means such as a VCO or a PLL is not especially required, leading to a reduction in the area of the apparatus.

According to the present invention, a filter characteristic adjusting apparatus comprises: a test signal generation unit for receiving a reference signal, and generating a test signal having a frequency equal to a frequency characteristic of a low-pass type fourth-order Butterworth filter, which test signal is to be supplied to the filter when adjusting the frequency characteristic of the filter; and a control signal generation unit for generating a control signal that controls a characteristic frequency of the filter by using the test signal, and a filter output signal that is obtained when the test signal is inputted to the low-pass type fourth-order Butterworth filter.

Thereby, it is not necessary to provide a phase shift unit, leading to a further reduction in the circuit area of the characteristic adjusting apparatus.

According to the present invention, a filter characteristic adjusting method for controlling a characteristic frequency of a filter comprises: a test signal generation step of generating a test signal to be supplied to the filter when performing characteristic adjustment for the filter; a phase shift step of shifting the phase of the test signal that is generated in the test signal generation step so that a predetermined phase difference is generated between the test signal and an ideal filter output signal that is to be obtained when the test signal is inputted to the filter, on the basis of a phase characteristic of the filter and a frequency of the test signal; and a control signal generation step of generating a control signal for controlling the characteristic frequency of the filter by using the filter output signal that is obtained when the test signal is inputted to the filter and the test signal that is phase-shifted in the phase shift step.

Thereby, the characteristic of the filter is directly measured during characteristic adjustment for the filter, and the filter output signal is detected at the timing of rising or falling of a signal that is obtained by phase-shifting the test signal, and then a control signal for controlling the frequency characteristic of the filter is generated on the basis of the result of the detection. Therefore, the filter characteristic adjustment can be carried out in a short time.

According to the present invention, in the filter characteristic adjusting method, the control signal generation step comprises: a phase comparison step of comparing the phase of the filter output signal that is obtained when the test signal is inputted to the filter with the phase of the test signal that is phase-shifted in the phase shift step; and a binary search step of performing a binary search for a result of comparison performed in the phase comparison step so as to generate the control signal.

Thereby, the filter characteristic is directly measured during characteristic adjustment for the filter, and the filter output signal is detected at the timing of rising or falling of a signal that is obtained by phase-shifting the test signal, and then a control signal for controlling the frequency characteristic of the filter is generated on the basis of the result of the detection. Therefore, the filter characteristic adjustment can be carried out in a short time.

EFFECTS OF THE INVENTION

The filter characteristic adjusting apparatus according to the present invention is provided with the phase shift unit for shifting the phase of the test signal by a predetermined amount when performing characteristic adjustment for the filter, and the control signal is generated on the basis of the phase difference between the output from the filter and the output from the phase shift unit, whereby the filter characteristic adjusting process can be speeded up.

Further, according to the filter characteristic adjustment apparatus of the present invention, since the same filter is used for the normal operation of the filter and the tuning operation thereof to optimize the characteristic frequency of the filter, it is not necessary to provide an additional PLL circuit or VCO, thereby preventing an increase in the circuit area.

Further, according to the filter characteristic adjustment apparatus of the present invention, in the filter control signal generation unit, the phase shift unit shifts the phase of the test signal so that the phase difference between the test signal and the ideal filter output signal that is obtained when the test signal is inputted to the filter which is in the optimum state after the characteristic adjustment becomes 180°, and the phase difference between the phase-shifted test signal and the filter output signal is generated by digital processing using binary search. Therefore, the control signal is generated in a short time, and the construction of the filter characteristic adjustment apparatus is simplified and realized with a small area.

Further, according to the filter characteristic adjusting apparatus of the present invention, particularly when the filter is a fourth-order Butterworth low-pass filter or a fourth-order Butterworth high-pass filter, since the phase characteristic of the filter theoretically rotates by 180° if the frequency of the signal inputted to the filter is equal to the characteristic frequency of the filter, it is not necessary to provide a phase shift unit. Therefore, the construction of the characteristic adjusting apparatus is further simplified and reduced in area.

BRIEF DESCRIPTION OF THE DRAWINGS

FIG. 9 is a diagram for explaining a binary search process in the logic unit according to the first embodiment.

DESCRIPTION OF REFERENCE NUMERALS

Figure 1:
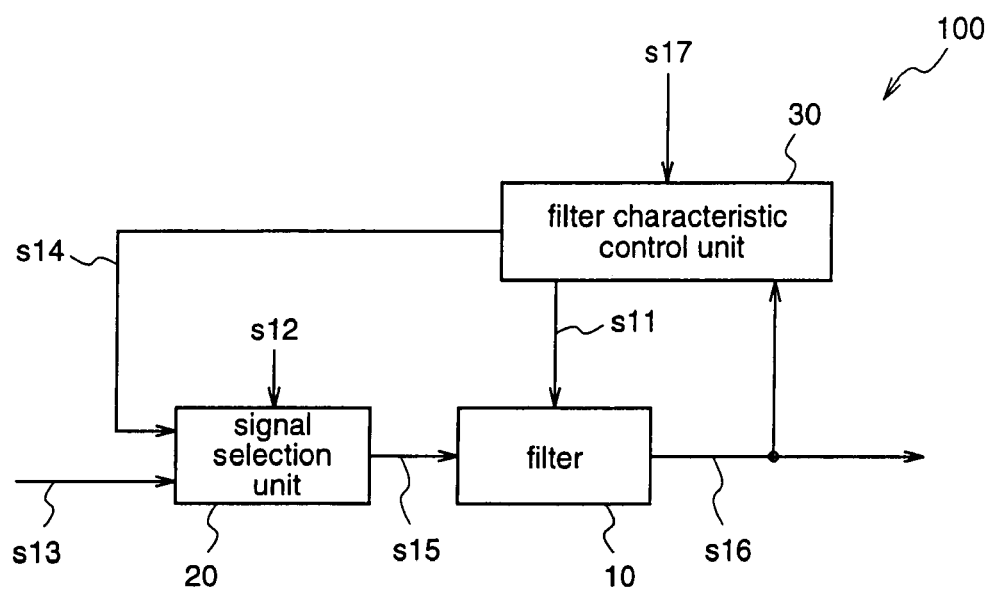
FIG. 1 is a diagram illustrating the construction of a filter characteristic adjusting apparatus according to a first embodiment of the present invention.

10 . . . filter
20, 61 . . . signal selection unit
30, 50 . . . filter characteristic adjusting unit
31, 51 . . . test signal generation unit
32 . . . phase shift unit
33, 53 . . . control signal generation unit
34 . . . first comparator
35 . . . second comparator
36 . . . phase comparator
37 . . . logic unit
38 . . . binary search unit
39 . . . control signal determination unit
40 . . . fourth-order Butterworth low-pass filter
41~44 . . . Gm circuit
45~48 . . . C circuit
60 . . . PLL circuit
61 . . . VCO
62 . . . oscillation frequency measurement unit
63 . . . control unit
74 . . . response waveform period measurement unit
77 . . . step signal generation unit
78 . . . control unit

BEST MODE TO EXECUTE THE INVENTION

Embodiment 1

Hereinafter, a first embodiment of the present invention will be described with reference to the drawings.

FIG. 1 is a diagram illustrating a construction of a filter characteristic adjusting apparatus according to the first embodiment. In FIG. 1, a filter characteristic adjusting apparatus 100 comprises a filter 10, a signal selection unit 20 that selects a filter input signal s15 to be input to the filter 10 on the basis of a selection signal s12, and a filter characteristic control unit 30 that outputs a control signal s11 for adjusting the characteristic of the filter 10 on the basis of a reference signal s17. The signal selection unit 20 receives a normal input signal s13 that is a processing target when the filter characteristic adjusting apparatus 100 performs normal operation (hereinafter referred to as "normal mode"), and a test signal s14 that is generated by the filter characteristic control unit 30, and the signal selection unit 20 selects either the normal input signal s13 or the test signal s14 as a filter input signal s15 on the basis of the selection signal s12, and inputs the selected signal to the filter 10. To be specific, when the filter characteristic adjusting apparatus 100 is in the normal mode, the signal selection unit 20 selects the normal input signal s13, and inputs the signal to the filter 10. On the other hand, when the filter characteristic adjusting apparatus 100 is under characteristic adjustment (hereinafter referred to as "tuning mode"), the signal selection unit 20 selects the test signal s14, and inputs the signal to the filter 10. The selection signal s12 may be adjusted independently outside the apparatus 100 and inputted to the apparatus 100, or it may be outputted from the filter characteristic control unit 30.

Figure 2:
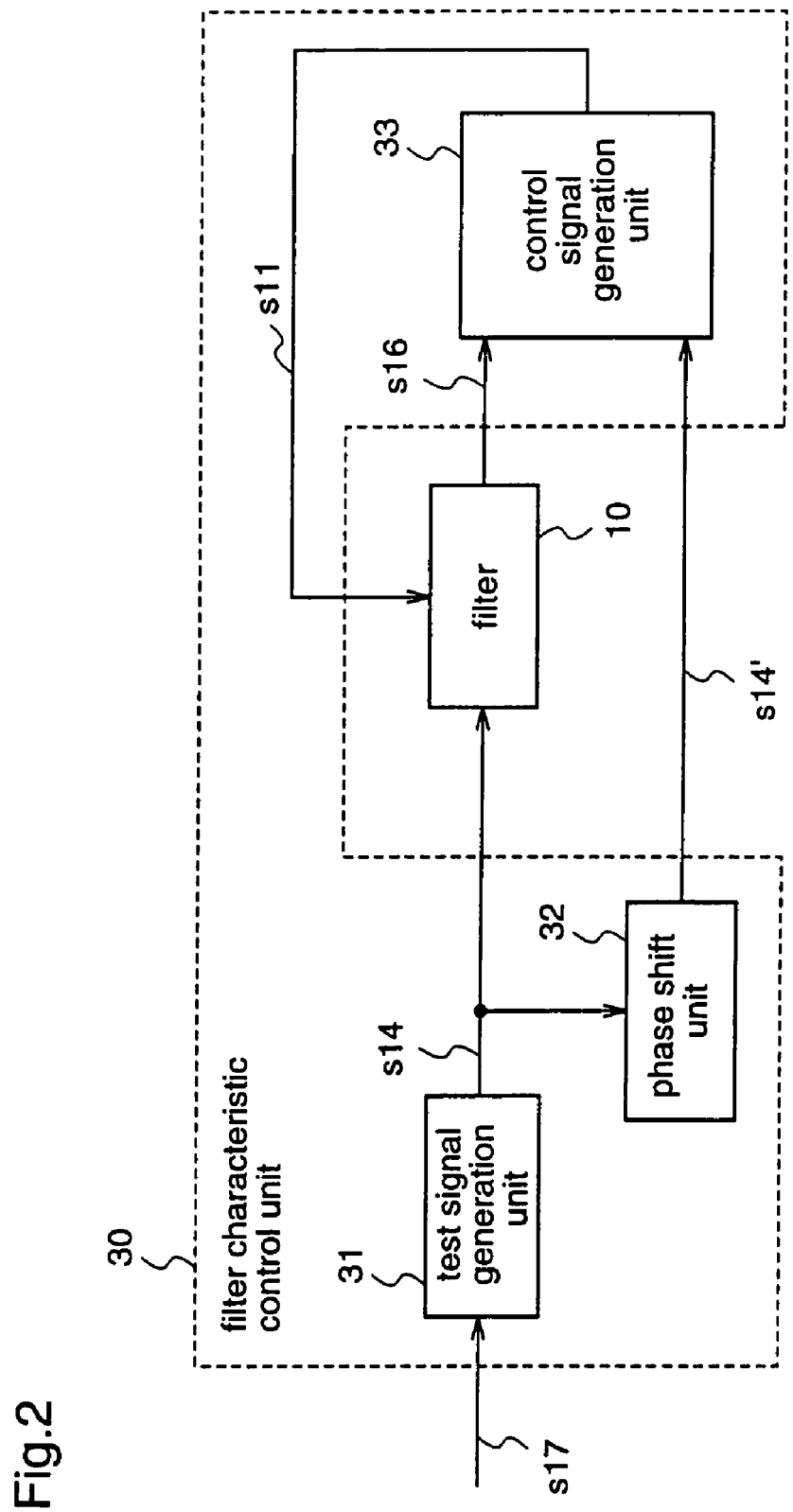
FIG. 2 is a diagram illustrating the constituents required for characteristic adjusting operation of the filter characteristic adjusting apparatus according to the first embodiment.

FIG. 2 is a diagram illustrating the specific construction of the filter characteristic control unit 30 included in the characteristic adjusting apparatus 100 according to the first embodiment. FIG. 2 shows only the constituents required for the tuning mode. In FIG. 2, the filter characteristic control unit 30 comprises a test signal generation unit 31 for generating a test signal s14 from a reference signal s17, a phase shift unit 32 for shifting the phase of the test signal s14 according to the phase characteristic of the filter 10, and a control signal generation unit 33 which receives a phase-shifted test signal s14' outputted from the phase shift unit 32, and a filter output signal s16 outputted from the filter 10, and generates a control signal s11 for controlling the frequency characteristic of the filter 10.

Figure 3:
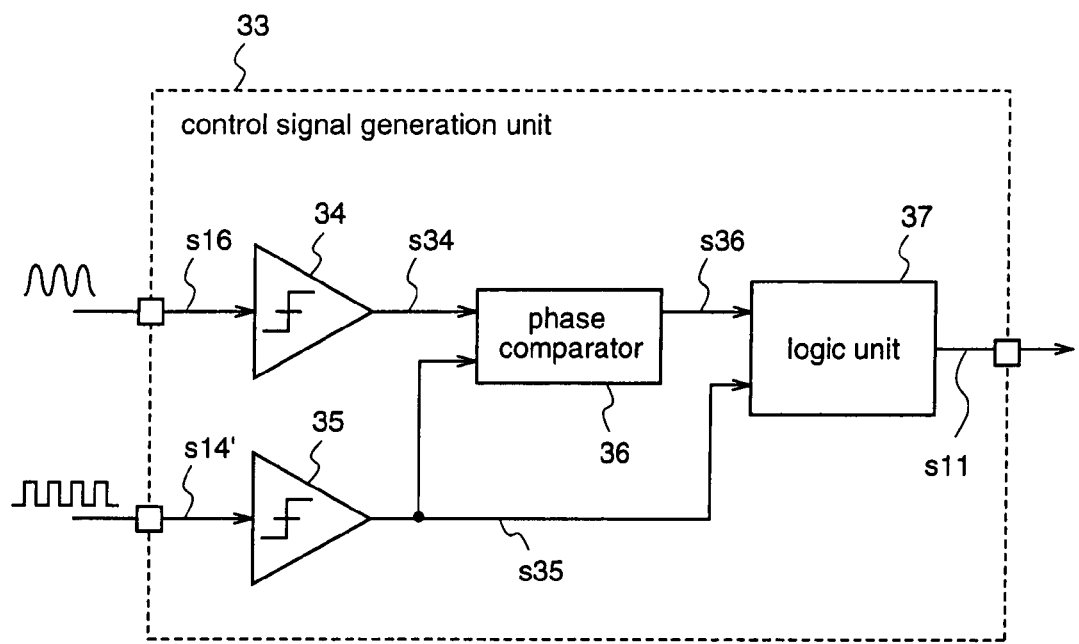
FIG. 3 is a diagram illustrating the detail of the construction of a control signal generation unit included in a filter characteristic control unit according to the first embodiment.

Furthermore, FIG. 3 is a diagram illustrating the specific construction of the control signal generation unit 33 included in the filter characteristic control unit 30. In FIG. 3, the control signal generation unit 33 comprises a first comparator 34 for generating a first binary signal s34 that is obtained by binarizing the filter output signal s16 on the basis of a center value of the test signal s14, a second comparator 35 for generating a second binary signal s35 that is obtained by binarizing the phase-shifted test signal s14' on the basis of the center value of the test signal s14, a phase comparator 36 for phase-comparing the first binary signal s34 and the second binary signal s35 to output a phase comparison result s36, and a logic unit 37 for generating the control signal s11 using the comparison result s36 and the second binary signal s35.

In this first embodiment, the center value of the test signal s14 is a reference value as a threshold value to be used for comparison by the first and second comparators 34 and 35. The reason why the second comparator 35 is provided although the phase-shifted test signal s14' is already a binary signal is because the first binary signal s34 and the second binary signal s35 should be inputted to the subsequent phase comparator 36 at the same timing.

Next, the operation will be described.

Figure 4:
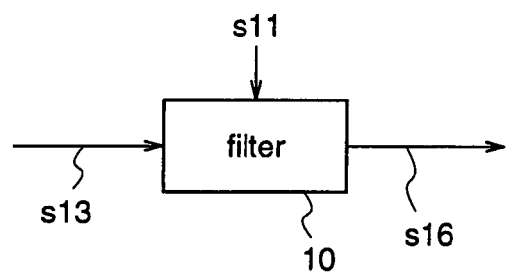
FIG. 4 is a diagram illustrating the constituents required for normal operation of the filter characteristic adjusting apparatus according to the first embodiment.

Initially, the normal operation of the filter 10 will be described with reference to FIG. 4. FIG. 4 is a diagram illustrating the construction which is equivalent to the normal mode of the filter according to the first embodiment.

The filter 10 goes into the normal mode after the control signal s11 for the filter 10 is generated by the filter characteristic adjusting operation that will be described later. At this time, as described above, the signal selection unit 20 selects the normal input signal s13 on the basis of the selection signal s12, and inputs the signal to the filter 10.

As shown in FIG. 4, during the normal mode, the normal input signal s13 is inputted to the filter 10 whose characteristic frequency is controlled and fixed, and the response waveform of the normal input signal s13 is outputted as the filter output signal s16.

Next, the characteristic adjusting operation for the filter 10 will be described with reference to FIGS. 2, 5, and 6.

Figure 5:
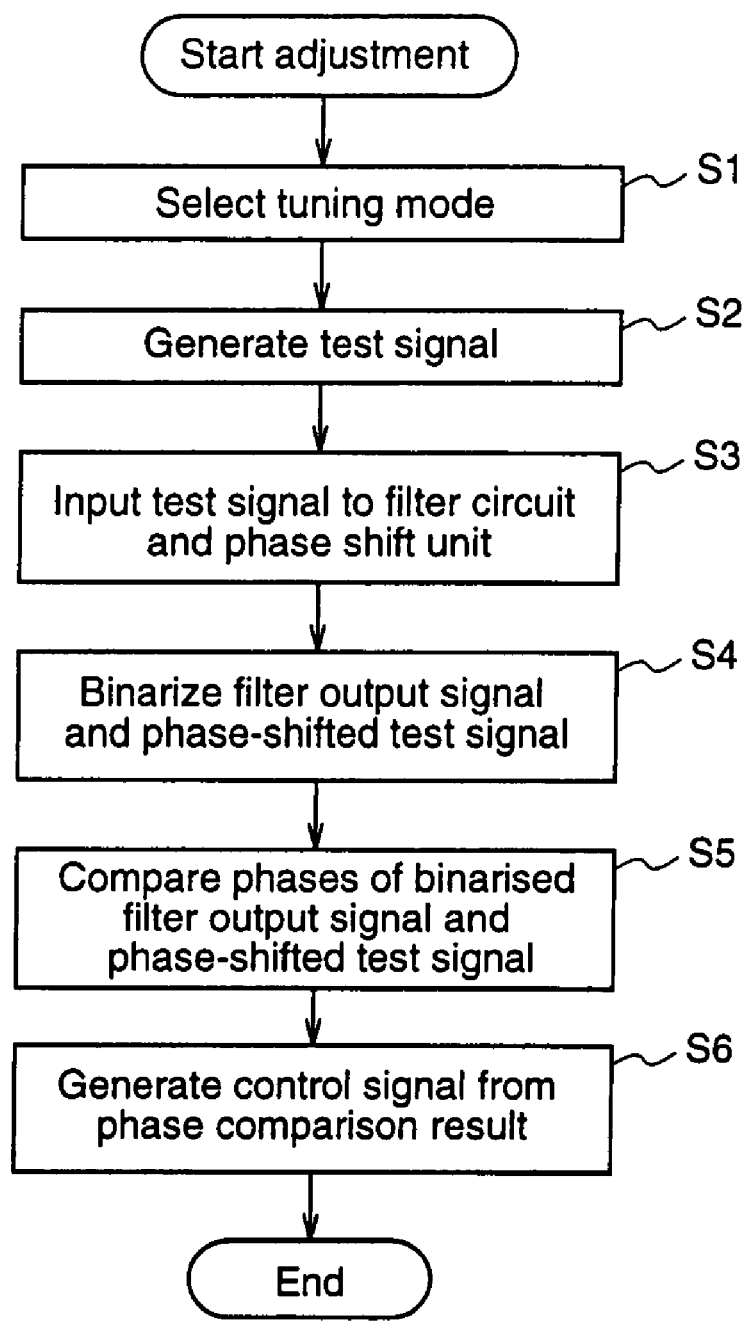
FIG. 5 is a diagram illustrating a sequence of steps during the characteristic adjusting operation of the filter characteristic adjusting apparatus according to the first embodiment.
Figure 6:
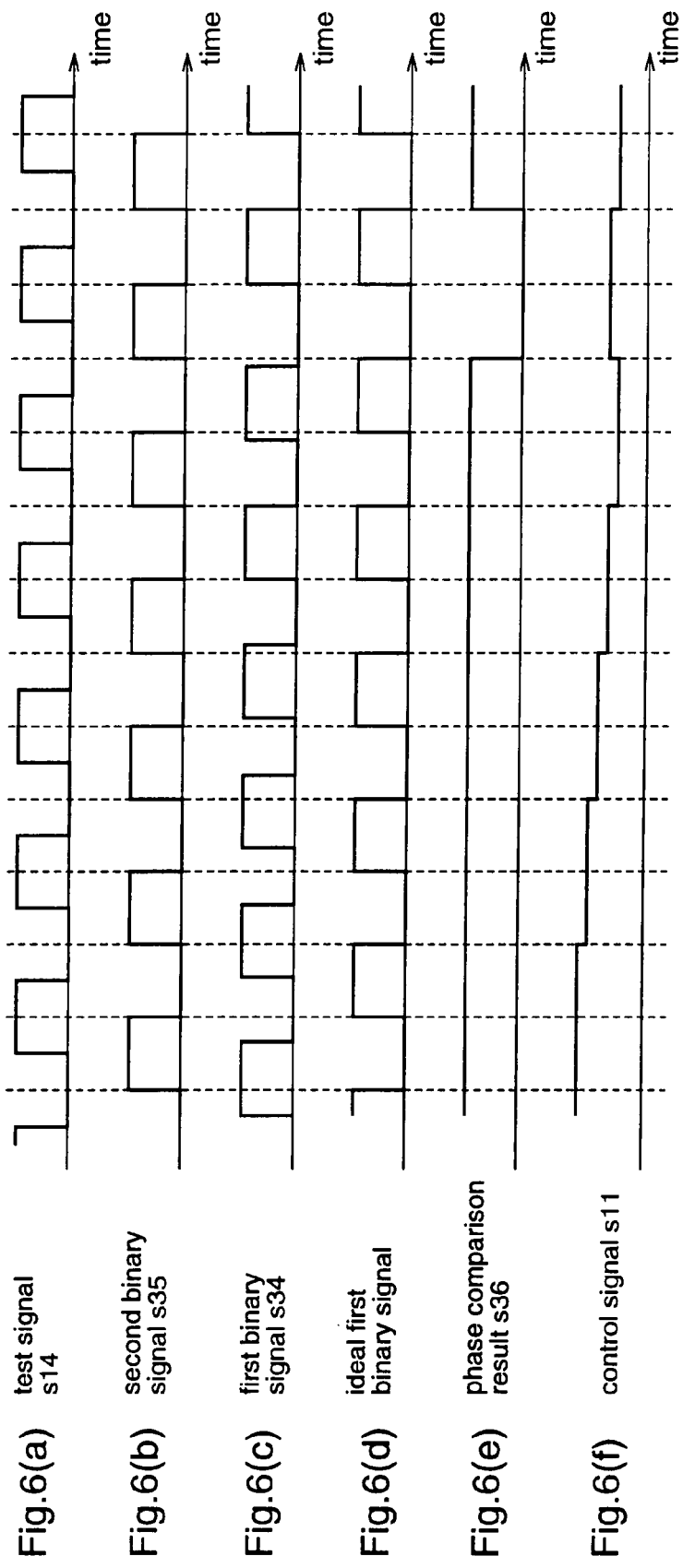
FIG. 6 is a diagram illustrating signal waveforms from the respective parts in the filter characteristic control unit according to the first embodiment.

FIG. 5 is a flowchart for explaining the tuning mode of the filter characteristic adjusting apparatus according to the first embodiment, and FIG. 6 is a signal waveform diagram of the control signal generation unit in the filter characteristic adjusting apparatus according to the first embodiment.

Initially, the filter characteristic adjusting apparatus 100 is set in the tuning mode (step S1). To be specific, the signal selection unit 20 shown in FIG. 1 is set so that the test signal s14 is selected by the selection signal s12, and an initial value C0 is set in the logic unit 37. The construction and specific processing of the logic unit 37 will be described later.

Then, the test signal s14 is generated (step S2). The test signal s14 is generated by the test signal generation unit 31 in the filter characteristic control unit 30 on the basis of the reference signal s17. It is assumed that the test signal s14 is a pulse signal as shown in FIG. 6($a$), and has the same frequency as the characteristic frequency of the filter 10. At this time, the amplitude of the test signal s14 is restricted so as to be within the dynamic range of the filter 10.

The test signal s14 is outputted to the filter 10 and to the phase shift unit 32c (step S3).

The filter 10 receives the test signal s14, and outputs the filter output signal s16.

Figure 17:
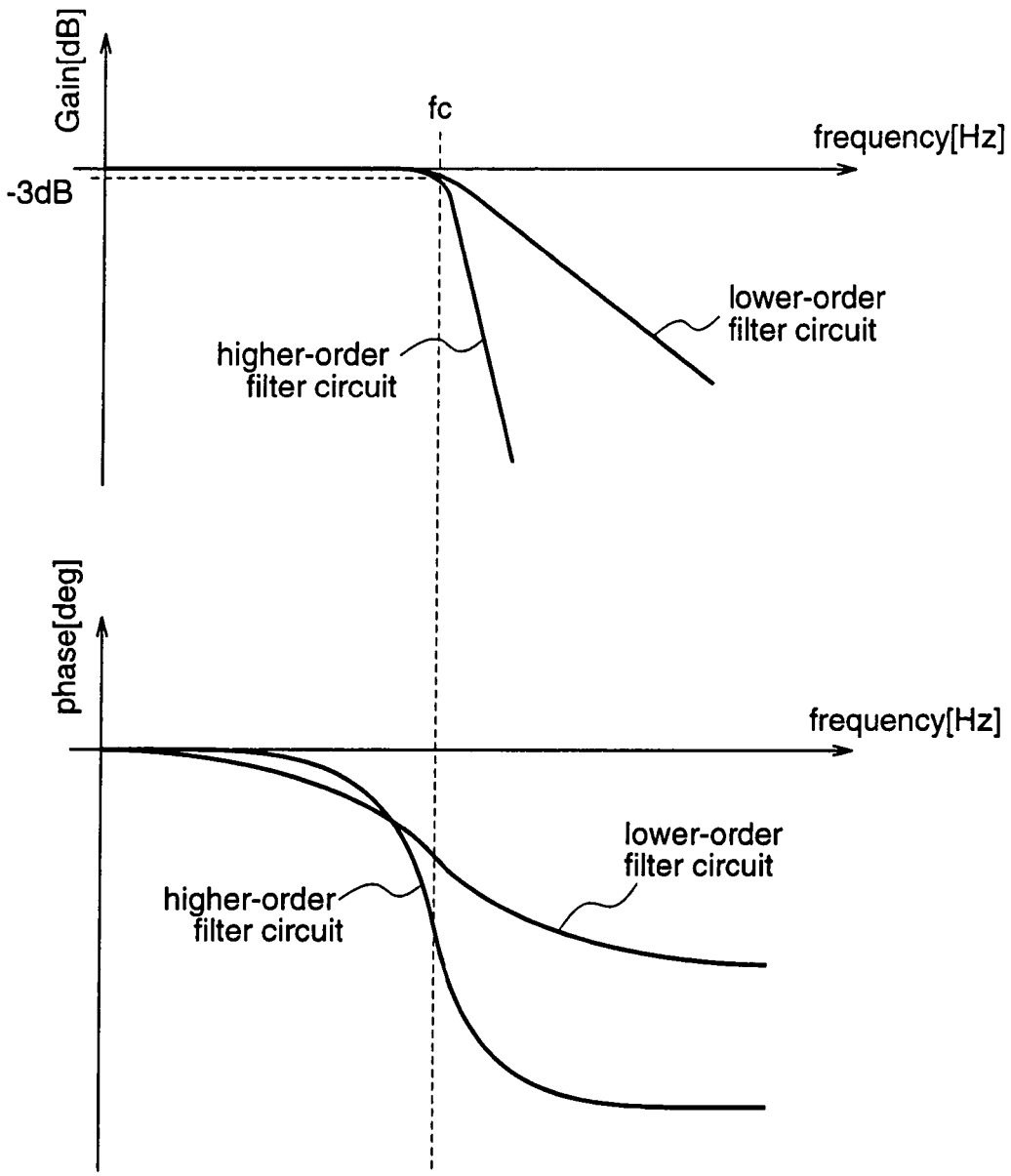
FIG. 17 is a diagram illustrating the frequency characteristics of two low-pass filters having different orders.
Figure 18:
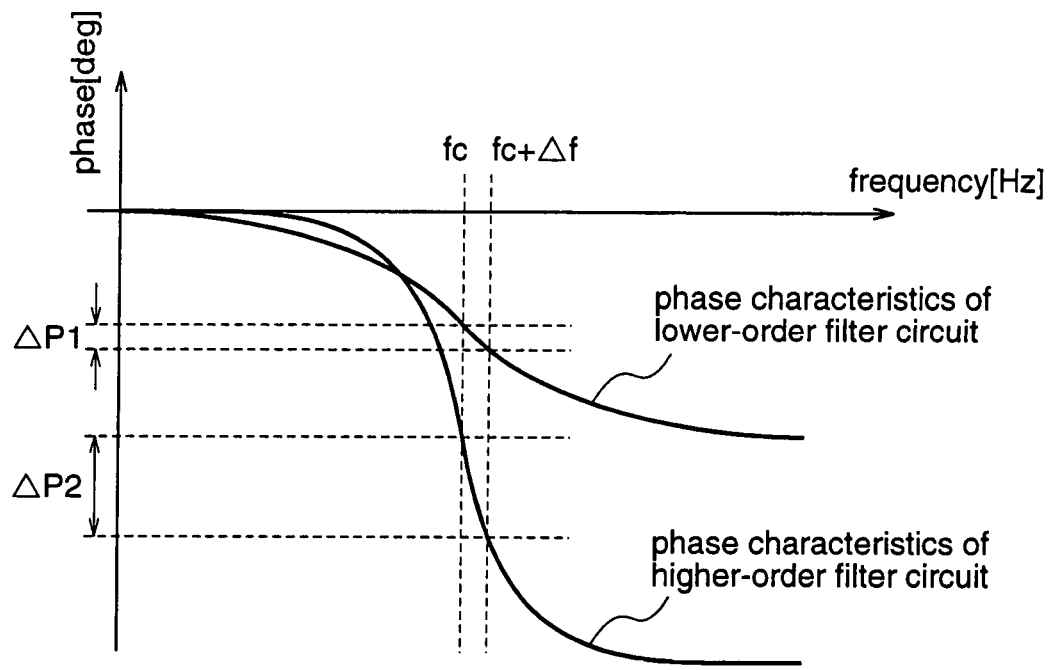
FIG. 18 is a diagram illustrating the phase characteristics of the two low-pass filters having different orders.

On the other hand, the phase shift unit 32 receives the test signal s14, and shifts the phase of the test signal s14 to output the phase-shifted test signal s14'. The phase shift amount is set in the phase shift unit 32 as follows. That is, the phase shift amount is set so that a phase difference between the ideal filter output signal s16 which is outputted from the filter 10 when the test signal s14 is inputted to the filter 10 whose frequency characteristic has already been adjusted, and the phase-shifted test signal s14' which is outputted from the phase shift unit 32, becomes 180°. As shown in FIG. 17, since the phase shift amount of the ideal filter output signal can be known in advance from the phase characteristic of the filter 10 if the frequency of the test signal to be inputted is determined, the phase amount for shifting the test signal s14 can be set on the basis of the phase shift amount.

Figure 7:
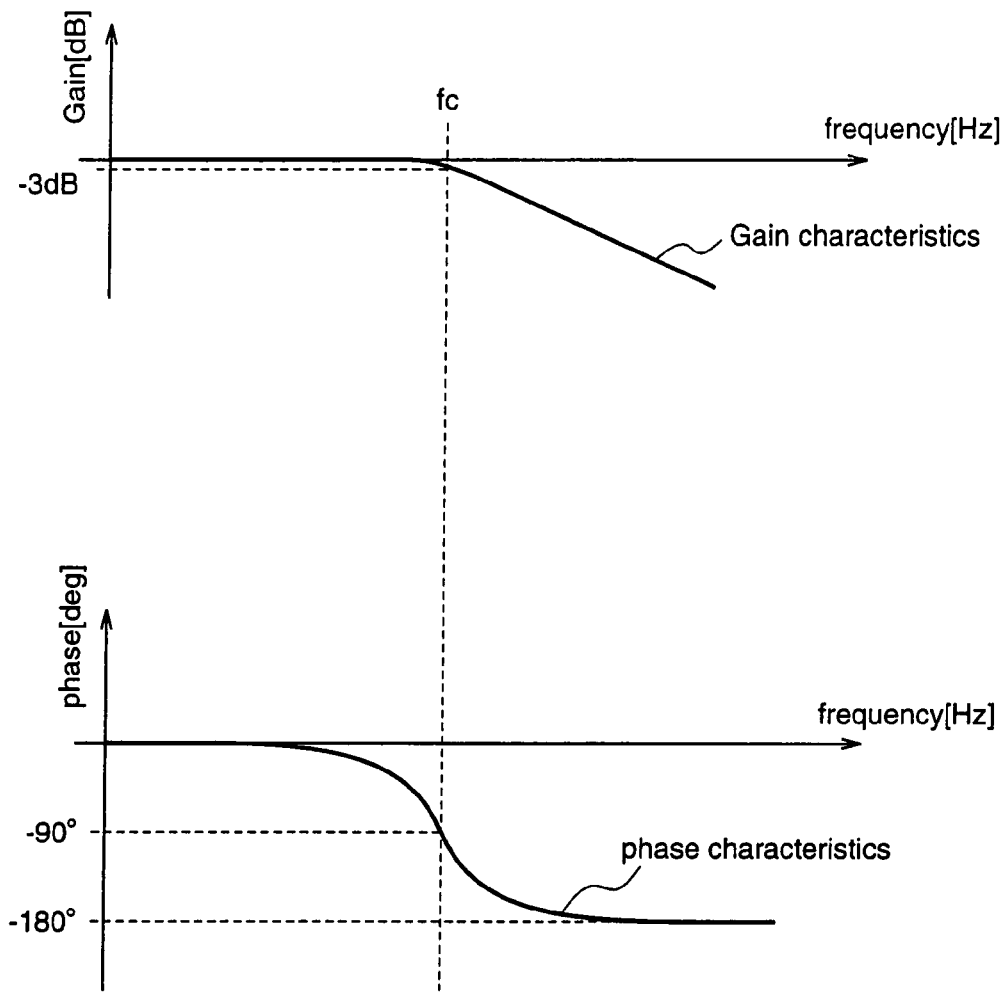
FIG. 7 is a diagram illustrating frequency characteristics of a second-order Butterworth low-pass filter.

For example, a description will be given of a case where the filter 10 is a second-order Butterworth low-pass filter. FIG. 7 shows the gain characteristic and frequency characteristic of the second-order Butterworth low-pass filter.

In the case of adopting the second-order Butterworth low-pass filter, as shown in FIG. 7, assuming that the frequency of the signal inputted to the filter matches the characteristic frequency fc of the filter, the phase of the response waveform outputted from the filter is 90° shifted from the phase of the input signal (refer to FIGS. 6($a$) and 6($b$)). Accordingly, when the test signal s14 having the same frequency as the characteristic frequency fc is inputted to the filter 10, the filter output signal s16 outputted from the filter 10 should be an ideal filter output which is phase-shifted by 90° relative to the test signal s14 if the characteristic of the filter 10 is optimum, and therefore, −90° is set as the phase shift amount to be shifted by the phase shift unit 32.

The filter output signal s16 outputted from the filter 10 and the phase-shifted test signal s14' obtained in the phase shift unit 32 are inputted to the control signal generation unit 33, and the phase of the filter output signal s16 is compared with the phase of the phase-shifted test signal s14' (step S5), and then the control signal s11 for controlling the frequency characteristic of the filter 10 is generated on the basis of the result of phase comparison (step S6).

Hereinafter, the control signal generation unit 33 will be described in detail.

Initially, the filter output signal s16 is inputted to the first comparator 34 while the phase-shifted test signal s14' is inputted to the second comparator 35. The first and second comparators 34 and 35 binarize the filter output signal s16 and the phase-shifted test signal s14' on the basis of the center value of the test signal s14, and output the binarized signals as first and second binary signals s34 and s35, respectively (refer to FIGS. 6($b$) and 6($c$)). It is assumed that each of the comparators 34 and 35 outputs a "L" level when the level of the signal is lower than the center value of the test signal, and outputs a "H" level when it is higher than the center value.

Then, the phase comparator 36 compares the phases of the first and second binary signals s34 and s35, and outputs a phase comparison result s36. The phase comparator 36 is implemented by such as a flip-flop, and latches the first binary signal s34 at a rising edge or a falling edge (in FIG. 6, a rising edge) of the second binary signal s35 with the second binary signal s35 as a clock, and at this time, the phase comparator 36 outputs a "H" level or a "L" level when the level of the first binary signal s34 is "H" or "L", respectively (refer to FIG. 6($e$)).

With reference to FIG. 6, when the filter 10 is in the optimum state, the relationship between the first binary signal s34 (the digital value of the filter output signal) and the second binary signal s35 (the digital value of the phase-shifted test signal) should be equal to the relationship between those shown in FIGS. 6($d$) and 6($b$), and therefore, the phase comparator 36 outputs a signal s36 of "H" level when the phase of the first binary signal s34 is advanced relative to the ideal first binary signal (6($d$)), or a signal s36 of "L" level when the phase is delayed.

In the logic unit 37, the control signal s11 that is set at the initial value C0 in step S1 is fine-tuned on the basis of the state of the phase comparison result s36.

In this first embodiment, the fine tuning is performed so as to lower the value of the control signal s11 when the phase comparison result s36 is "H" level, and increase the value of the control signal s11 when the phase comparison result s36 is "L" level. The period of the fine tuning is a predetermined period during which the second binary signal s35 is counted by n times (n: integer not less than 1). That is, when the number-of-counts n is larger, the precision of the filter characteristic adjustment is increased although the filter adjustment takes longer time. On the other hand, when the number-of-counts n is smaller, the precision of the filter characteristic adjustment is degraded although the filter adjustment takes less time.

Figure 8:
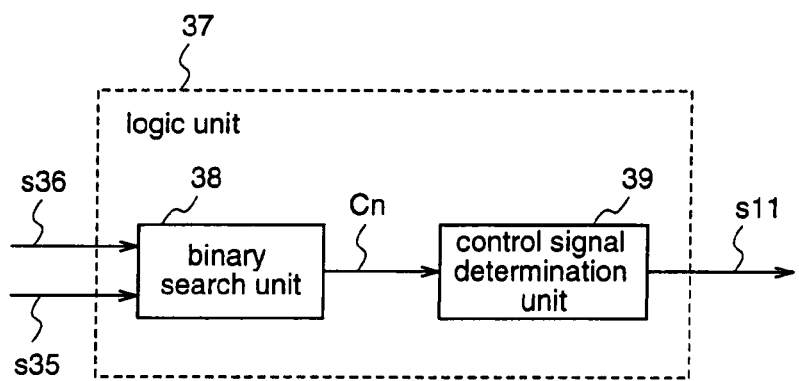
FIG. 8 is a diagram illustrating an example of construction of a logic unit included in the filter characteristic control unit according to the first embodiment.
Figure 10:
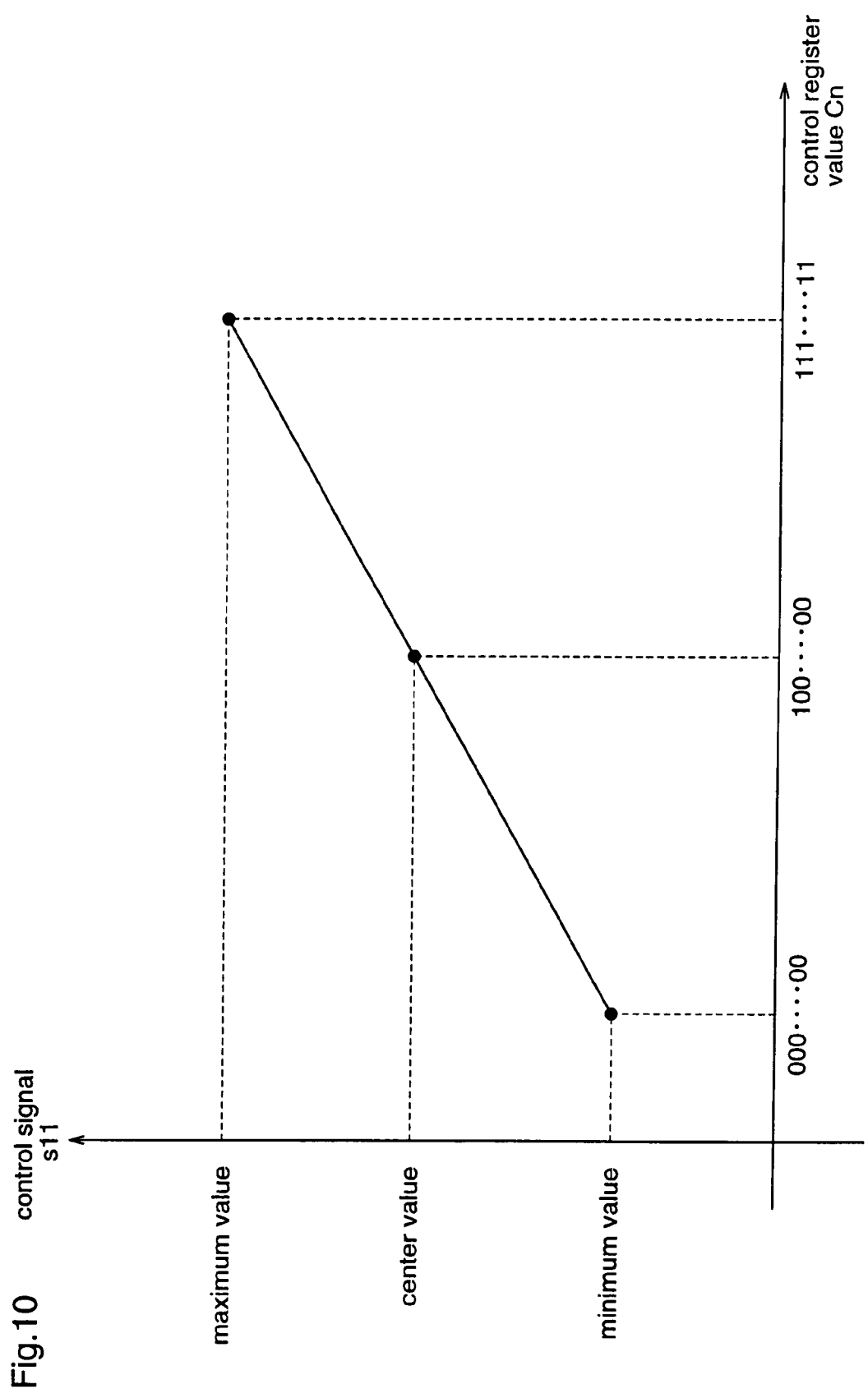
FIG. 10 is a diagram for explaining a process to be performed by a control signal determination unit included in the logic unit according to the first embodiment.

For example, the logic unit 37 is implemented by the construction shown in FIG. 8. FIG. 8 is a diagram illustrating an example of the specific construction of the logic unit 37, FIG. 9 is a diagram for explaining a processing to be performed by a binary search unit in the logic unit, and FIG. 10 is a diagram for explaining a processing to be performed by a control signal determination unit in the logic unit.

As shown in FIG. 8, the logic unit 37 comprises a binary search unit 38 which subjects the phase comparison result s36 to a binary search processing using the second binary signal s35 as a clock, and a control signal determination unit 39 which determines a value of the control signal s11 according to an n-bit control register value Cn that is generated in the binary search unit 38.

As described above, the initial value C0 is set in the binary search unit 38 in step S1 in FIG. 5. The initial value C0 has "1" for only the most significant one bit, and "0" for the other lower bits (Step0 in FIG. 9).

Thereafter, the information of the phase comparison result s36 is monitored for each timing of a rising edge or a falling edge of the second binary signal s35 (in FIG. 6, rising edge timing). To be specific, at the timing of the rising edge of the second binary signal s35, the most significant bit of the control register value C0 is set to "1" or "0" when the state of the phase comparison result s36 is "H" level or "L" level, respectively, and a bit that is one bit lower than the most significant bit is set to "1", thereby generating a control register value C1 (Step1 in FIG. 9).

Then, at the timing of the next rising edge of the second binary signal s35, the bit that is one bit lower than the most significant bit of the control register value C1 is set to "1" or "0" when the phase comparison result s36 is "H" level or "L" level, respectively, and a bit that is two bits lower than the most significant bit is set to "1", thereby generating a control register value C2 (Step2 in FIG. 9).

Thereafter, in like manner as described above, the binary search operation for the value of the (n−i+1)th bit (i indicates the number of steps, and it is an integer satisfying 1≦i≦n) of the n-bit control register value Cn, i.e., the operation of determining the (n−i+1)th bit of the control register value Cn to "1" or "0" according to the state of the phase comparison result s36, is successively continued up to n times, thereby obtaining the control register value Cn (Step(n) in FIG. 9). In FIG. 9, "*" indicates that the corresponding bit is either "1" or "0".

By performing the above-mentioned operation, for example, a control register value C7="1111101" is obtained for the relationship shown in FIG. 6.

The control register value Cn obtained as described above is inputted to the control signal determination unit 39. In the control signal determination unit 39, a value of a control signal s11 corresponding to the control register value Cn is determined. The control signal s11 and the control register value Cn are in the relationship of one-to-one correspondence as shown in FIG. 10. When the control register value Cn is "000 . . . 00" which is the smallest value, the control signal s11 also has the smallest value. When the control register signal Cn is "111 . . . 11" which is the largest value, the control signal s11 also has the largest value. As shown in FIG. 10, usually, the initial value C0 of the control register value corresponds to the center value of the value of the control signal s11. Further, since the number of steps in the binary search unit 38 varies depending on the number of bits of the control register value Cn, the adjustment time for the frequency characteristic of the filter 10 is restricted.

The characteristic frequency of the filter 10 is controlled by the control signal s11 which is thus determined, thereby determining the characteristic frequency of the filter 10.

When the tuning operation is ended, the filter characteristic adjusting apparatus 100 enters the normal mode state, and the signal selection unit 20 selects the normal input signal s13 on the basis of the selection signal s12, and thereby the flow of the signal before and behind the filter 10 becomes as shown in FIG. 4.

Even when the filter 10 has a differential construction, the same tuning operation as mentioned above can be applied. In this case, differential signals are input to the first and second comparators 34 and 35, respectively, one of the differential signals is used as a reference to perform the same processing.

As described above, according to the first embodiment, a test signal s14 having a frequency equal to the characteristic frequency of the filter 10 in the state where the frequency characteristic thereof has been adjusted is directly input to the filter 10 that is used for the normal operation, and adjustment is performed so that the characteristic frequency of the filter 10 becomes equal to the design value. Therefore, it is not necessary to additionally provide a VCO or a PLL circuit, resulting in considerable reduction in the circuit scale of the filter characteristic adjusting apparatus 100.

Furthermore, according to the first embodiment, the filter characteristic control unit 30 for adjusting the characteristic of the filter 10 is provided with the phase shift unit 32 for shifting the phase of the test signal s14 by a predetermined amount, and the control signal s11 for controlling the frequency characteristic of the filter 10 is generated from the phase-shifted test signal s14' that is obtained by the phase shift unit 32 and the filter output signal s16 that is obtained by inputting the test signal s14 into the filter 10. Therefore, when measuring the frequency of the filter 10, it is not necessary to use, as a clock, a separately generated sampling frequency higher than the characteristic frequency of the filter 10, leading to a further reduction in the circuit scale of the filter characteristic adjusting apparatus 100.

Furthermore, according to the first embodiment, in the phase shift unit 32, when it is assumed that the frequency characteristic of the filter 10 is in the optimum state, the test signal s14 is shifted by a predetermined amount so that a phase difference between the phase-shifted test signal s14' that is obtained by phase-shifting the test signal s14 and the filter output signal s16 becomes 180°, and the control signal s11 for controlling the frequency characteristic of the filter 10 is obtained on the basis of the phase difference between the phase-shifted test signal s14' and the filter output signal s16. Therefore, the control signal s11 can be obtained by the binary search processing, and thereby the characteristic frequency of the filter 10 can be adjusted in a short time. Further, since the filter characteristic adjusting apparatus is thus constructed, it can be applied to all filters by varying the phase shift amount to be set on the phase shift unit 32.

While in this first embodiment the frequency of the test signal s14 is matched to the characteristic frequency of the filter, these frequencies may be different from each other. In this case, the phase amount corresponding to the frequency of the test signal s14 is confirmed from the phase characteristic of the filter 10, and the phase shift unit 32 generates a phase-shifted test signal s14' having a phase difference of 180° from the phase amount.

Further, while in this first embodiment the first and second comparators 34 and 35 perform binarization using the center value of the test signal s14 as a reference signal, the reference signal to be actually used by the comparators is not restricted thereto. Further, the above-mentioned comparator may binarize the inputted signal on the basis of two reference signals, like a hysteresis comparator.

Embodiment 2

In a second embodiment of the present invention, a fourth-order Butterworth low-pass filter (hereinafter referred to as a fourth-order Butterworth LPF) or a fourth-order Butterworth high-pass filter is adopted.

Figure 11:
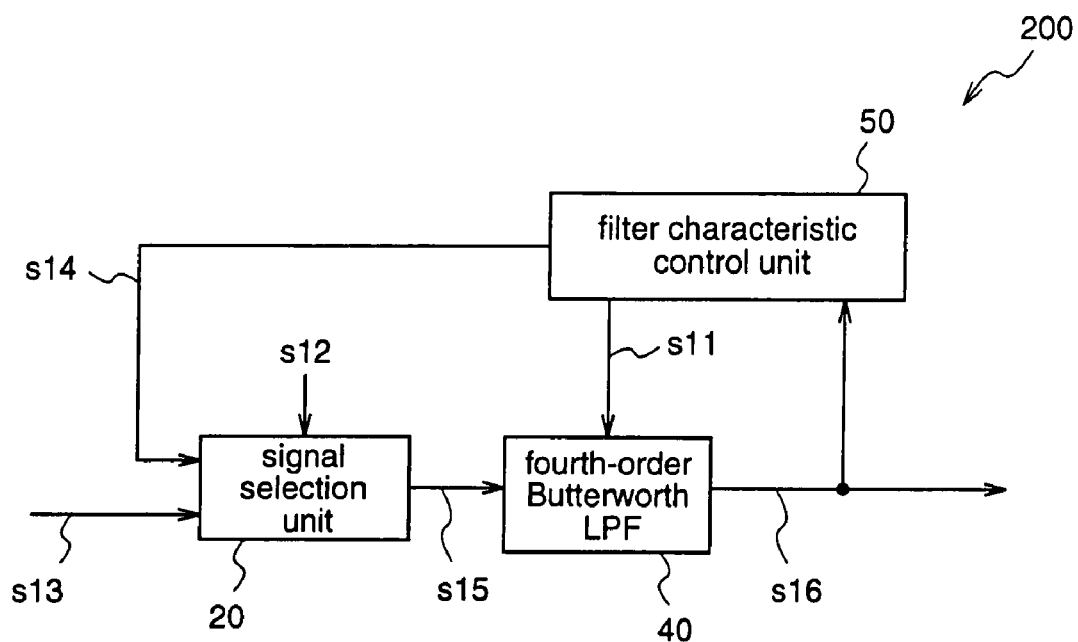
FIG. 11 is a diagram illustrating the construction of a filter characteristic adjusting apparatus according to a second embodiment of the present invention.
Figure 12:
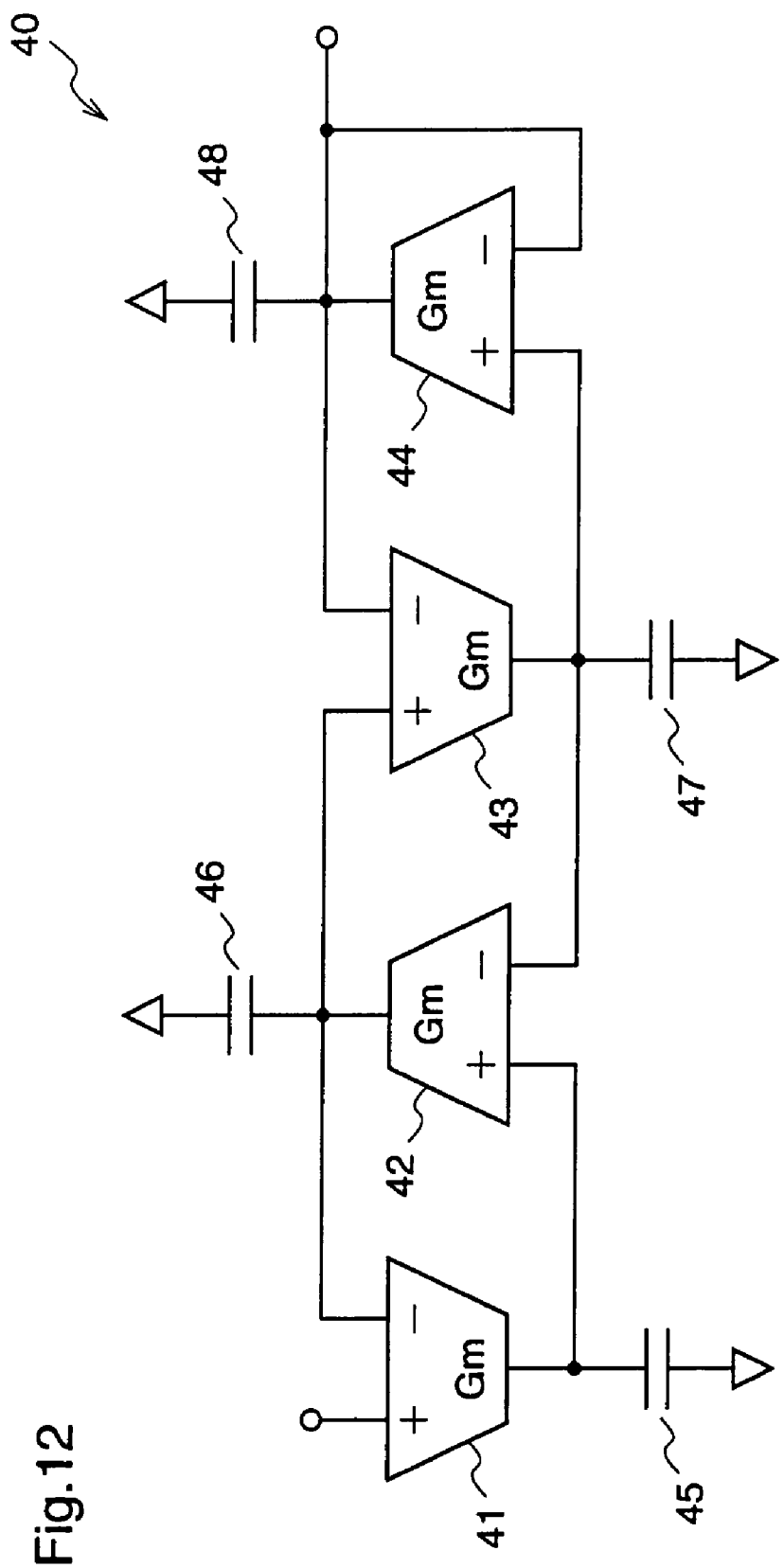
FIG. 12 is a diagram illustrating a fourth-order Butterworth low-pass filter comprising Gm and C circuits.
Figure 13:
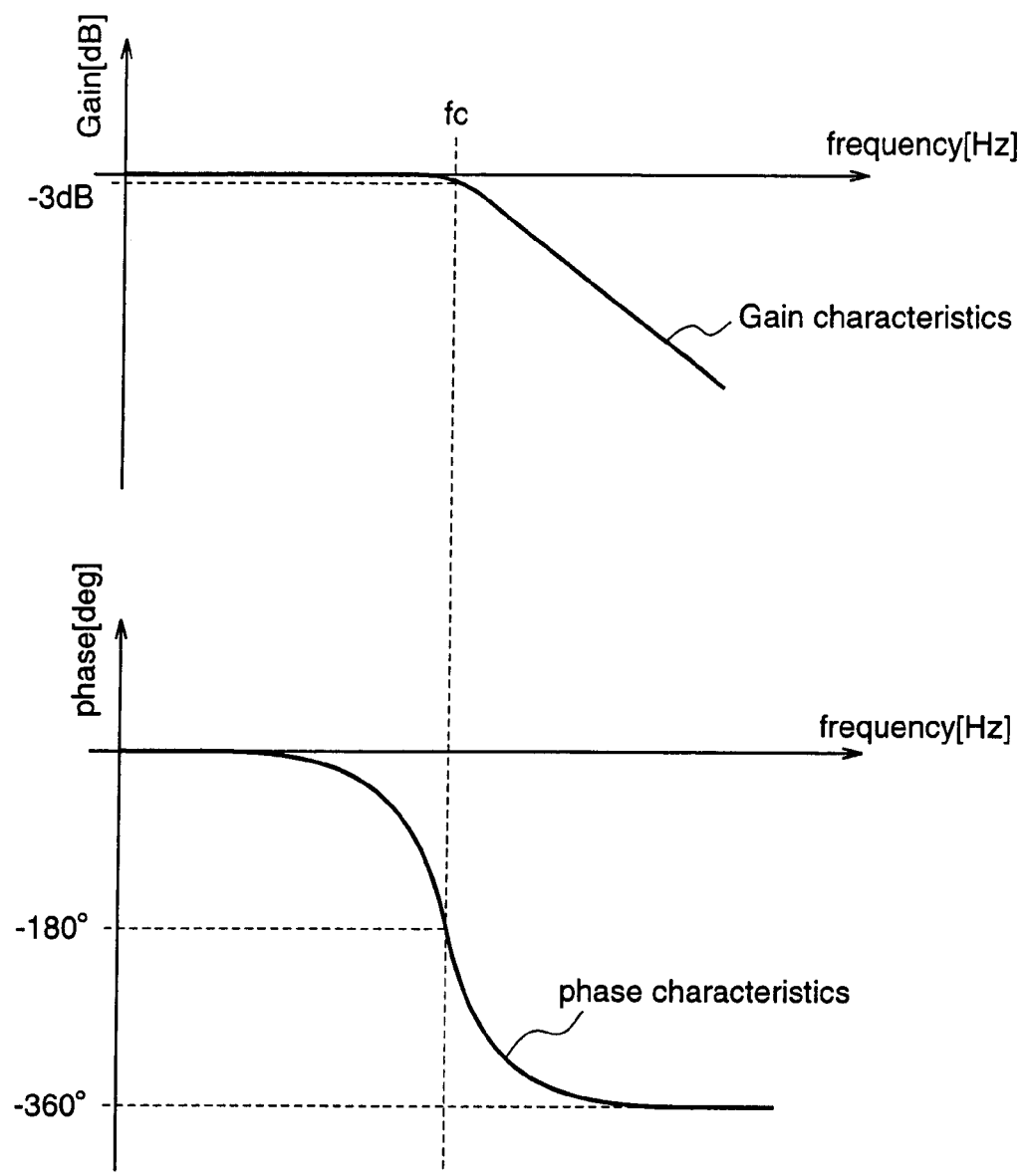
FIG. 13 is a diagram illustrating the frequency characteristics of the fourth-order Butterworth low-pass filter.
Figure 14:
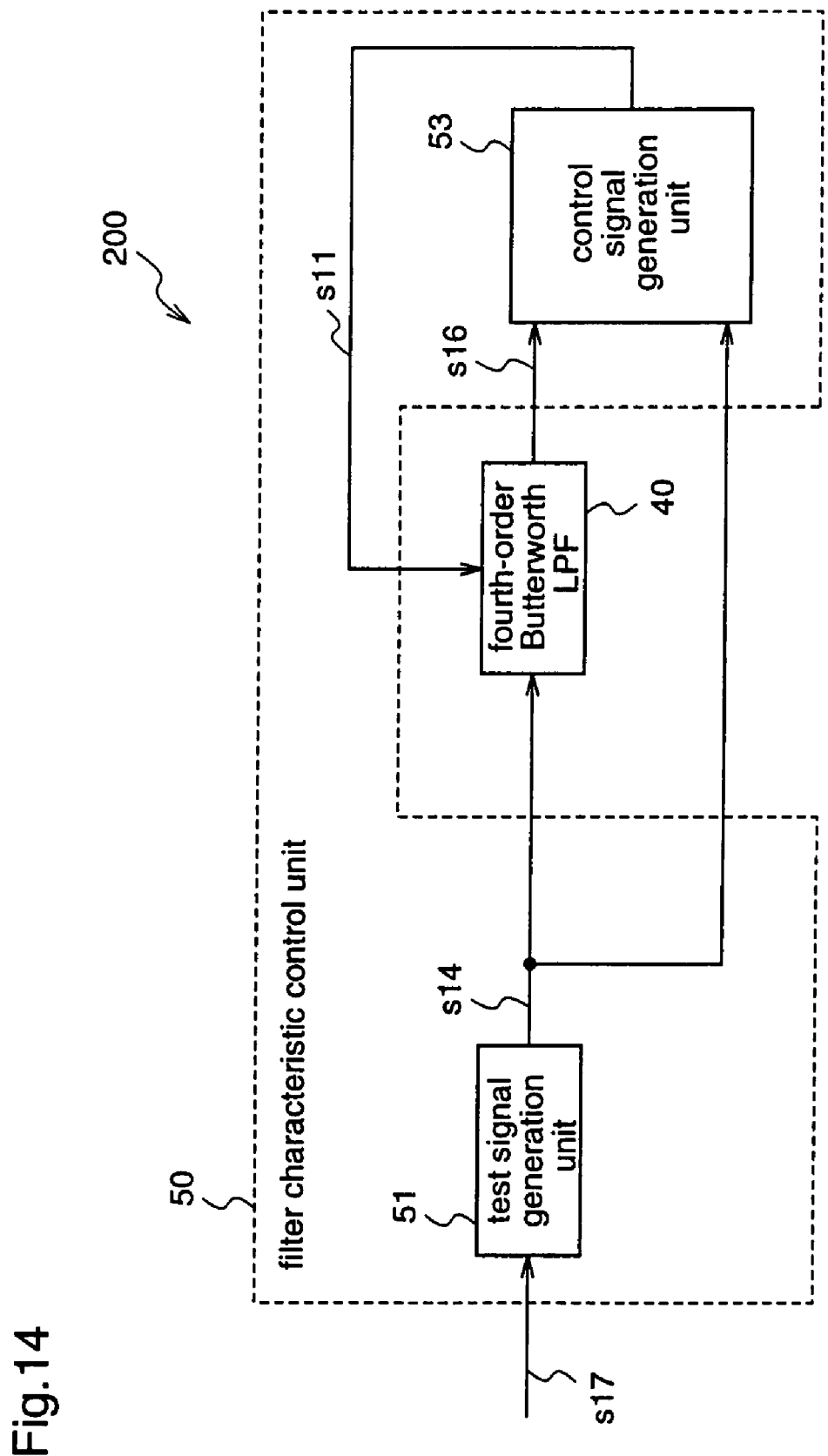
FIG. 14 is a diagram illustrating the constituents required for the characteristic adjusting operation of the filter characteristic adjusting apparatus according to the second embodiment.
Figure 15:
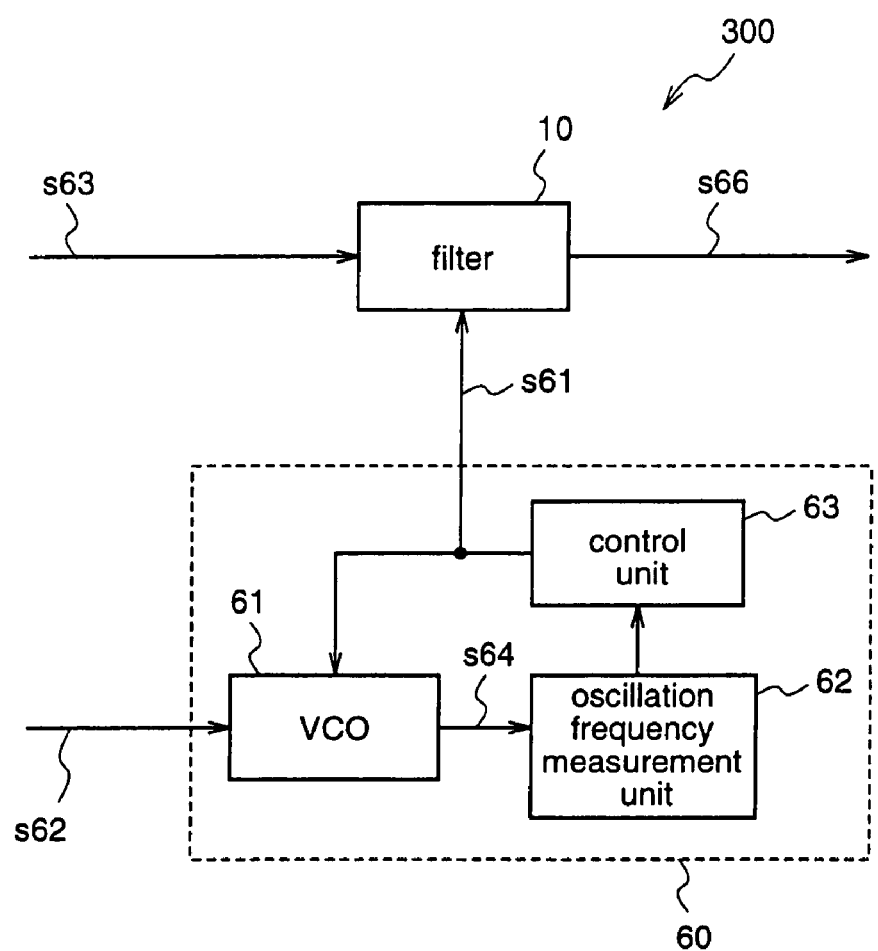
FIG. 15 is a diagram illustrating a conventional master/slave system filter characteristic adjusting apparatus using a PLL.
Figure 16:
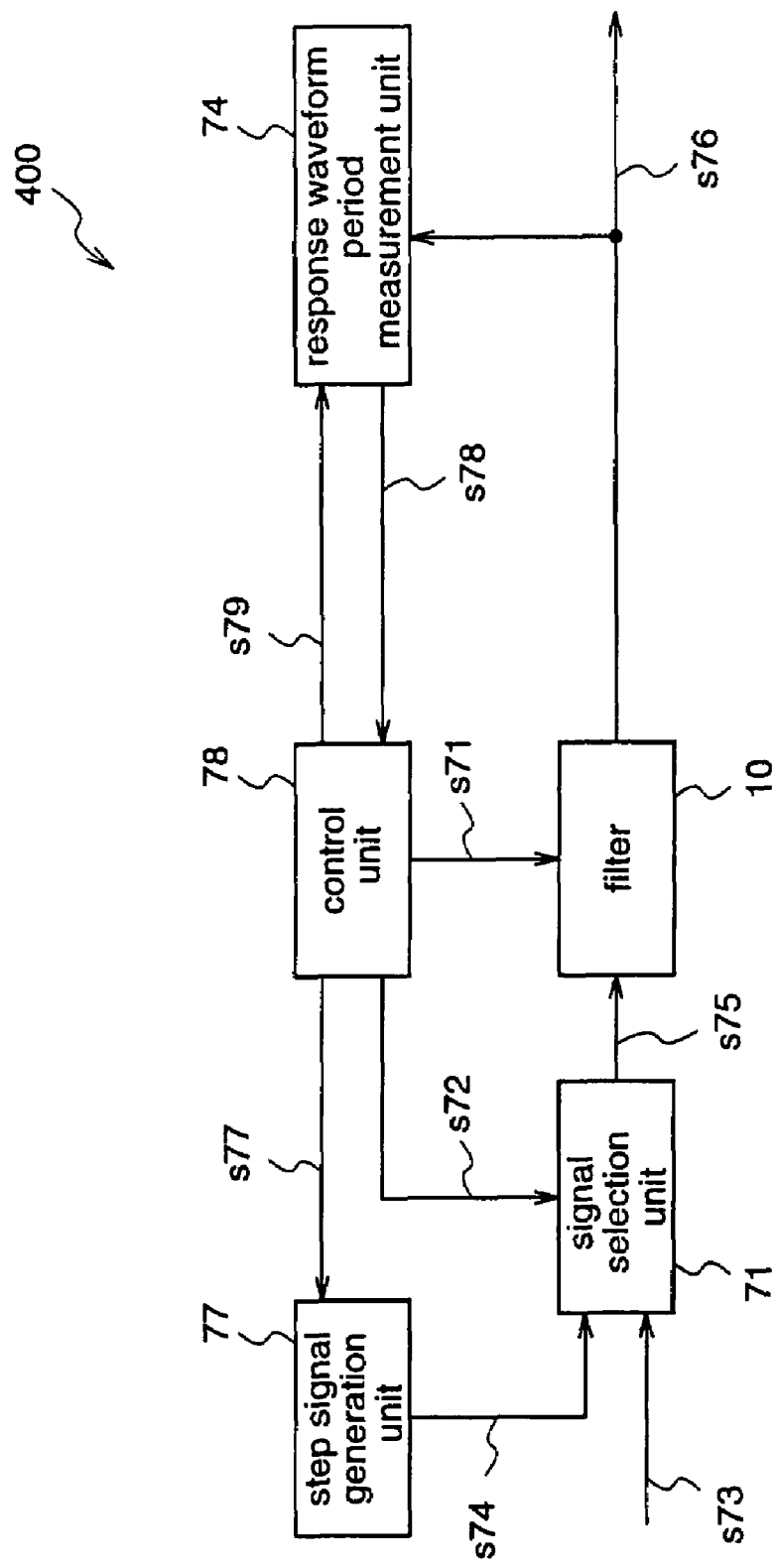
FIG. 16 is a diagram illustrating the construction of a conventional characteristic adjusting apparatus using a filter itself to be used for normal operation.

FIG. 11 is a diagram illustrating the construction of a filter characteristic adjusting apparatus according to the second embodiment, FIG. 12 is a diagram illustrating the construction of a fourth-order Butterworth LPF whose frequency characteristic is adjusted according to the second embodiment, FIG. 13 is a diagram illustrating the frequency characteristic of the fourth-order Butterworth LPF shown in FIG. 12, and FIG. 14 is a diagram illustrating the construction of a filter characteristic control unit 50 in the filter characteristic adjusting apparatus according to the second embodiment. FIG. 14 shows only the construction that is required for the tuning mode.

As shown in FIG. 11, the construction of the filter characteristic adjusting apparatus according to the second embodiment comprises, as in the first embodiment, a filter 40, a signal selection unit 20 which selects a filter input signal s15 to be input to the filter 40 on the basis of a selection signal s12, and a filter characteristic control unit 50 which outputs a control signal s11 for adjusting the characteristic of the filter 40 on the basis of a reference signal s17. The signal selection unit 20 receives, as in the first embodiment, a normal input signal s13 which is a processing target when the filter characteristic adjusting apparatus 200 is in the normal mode, and a test signal s14 which is generated by the filter characteristic control unit 50, and either the normal input signal s13 or the test signal s14 is selected as the filter input signal s15 according to the selection signal s12, and inputted to the filter 40. The selection signal s12 may be independently tuned outside the apparatus 200 and inputted to the apparatus 200, or it may be outputted from the filter characteristic control unit 50.

The fourth-order Butterworth LPF as the filter 40 that is a target of characteristic adjustment of the second embodiment is, as shown in FIG. 12, constituted by a Gm-C filter comprising Gm circuits 41 to 44 and C circuits 45 to 48. In this fourth-order Butterworth LPF 40, the Gm values of the Gm circuits 41 to 44 are adjusted by the control signal s11 to control the cutoff frequency as the characteristic frequency of the LPF 40.

As described above, when the filter 40 as a target of characteristic adjustment is the fourth-order Butterworth LPF as mentioned above, a phase shift unit is not necessary in the filter characteristic control unit 50 of the filter characteristic adjustment apparatus 200. The reason is that, as shown in FIG. 13, the fourth-order Butterworth LPF 40 has such phase characteristic that the phase thereof theoretically shifts by 180° at the cutoff frequency fc. Accordingly, particularly when the filter as a target of characteristic adjustment is the fourth-order Butterworth LPF 40, since the phase characteristic is shifted by 180° at the position of the characteristic frequency fc as shown in FIG. 13, it is not necessary to shift the phase of the test signal s14 so that the phase difference between the test signal s14 and the ideal filter output signal s16 becomes 180°, and therefore, the phase shift unit 32 can be dispensed with. Of course, the same goes for a fourth-order Butterworth high-pass filter.

Next, the operation will be described. Since the normal operation of the filter 40 according to the second embodiment is identical to that of the first embodiment, only the tuning operation of the filter 40 will be described hereinafter with reference to FIG. 14.

In the filter characteristic control unit 50 of the filter characteristic adjusting apparatus 200 according to the second embodiment, the test signal s14 that is generated in the test signal generation unit 51 is inputted to the control signal generation unit 53 through the fourth-order Butterworth LPF 40, and directly inputted to the control signal generation unit 53 without passing through the phase shift unit. In the control signal generation unit 53, after phase comparison between the directly inputted test signal s14 and the filter output signal s16 from the fourth-order Butterworth LPF 40 is carried out, the result of phase comparison is subjected to a binary search to obtain a control register value Cn, and a control signal s11 corresponding to the control register value Cn is detected, as in the first embodiment. Then, the Gm values of the Gm circuits 41 to 44 shown in FIG. 12 are controlled by the control signal s11, and consequently, the cutoff frequency of the filter 40 is adjusted to the desired frequency.

As described above, in the filter characteristic adjusting apparatus 200 according to the second embodiment, since the test signal s14 is directly inputted to the control signal generation circuit 53 as shown in FIG. 14, it is not necessary to provide the phase shift unit for shifting the phase of the test signal s14 by a predetermined amount, leading to a further reduction in the device scale.

APPLICABILITY IN INDUSTRY

A filter characteristic adjusting apparatus according to the present invention comprises, in order to adjust the frequency characteristic of a filter, a test signal generation unit for generating a test signal to be input to the filter, a phase shift unit for shifting the phase of the test signal, and a control signal generation unit for comparing the phases of the filter output signal and the test signal and generating a control signal by digital processing. Therefore, it is useful in accurately adjusting the characteristic frequency of the filter as well as in preventing an increase in the circuit scale.

The invention claimed is:

1. A filter characteristic frequency adjusting apparatus comprising:
   a filter:
   a test signal generation unit for receiving a reference signal, and generating a test signal to be supplied to said filter when adjusting a frequency characteristic of said filter, such that the filter outputs a predetermined filter output signal when the test signal is supplied to the filter;
   a phase shift unit for phase-shifting the test signal generated by the test signal generation unit so that a predetermined phase difference is generated between the phase of the test signal and the phase of said predetermined filter output signal, based on a phase characteristic of the filter and a frequency of the test signal; and
   a control signal generation unit for receiving the predetermined filter output signal and the phase-shifted test signal and for generating a control signal which controls a frequency characteristic of the filter, wherein said control signal generation unit comprises:
      a first comparator for comparing the predetermined filter output signal with a reference signal;
      a second comparator for comparing an output signal from the phase shift unit with the reference signal;
      a phase comparator for comparing the phases of binary signals that are respectively outputted from the first and second comparators; and
   a logic unit for generating the control signal by using the output from the phase comparator and the output from the second comparator, wherein said logic unit comprises:
      a binary search unit for receiving an output from the phase comparator and an output from the second comparator, and performing a binary search for a result of comparison from the phase comparator at a timing of a rising edge or a falling edge of the output from the second comparator; and
      a control signal determination unit for generating the control signal based on a value that is obtained by the binary search unit.

2. A filter characteristic frequency adjusting apparatus as defined in claim 1, wherein said phase shift unit shifts the phase of the test signal so that the phase difference between the test signal and the predetermined filter output signal becomes 180 degree.

3. A filter characteristic frequency adjusting apparatus as defined in claim 1, wherein said test signal is a pulse signal.

4. A filter characteristic frequency adjusting apparatus as defined in claim 3, wherein said test signal is a signal having a frequency equal to a predetermined cutoff frequency of the filter.

5. A filter characteristic frequency adjusting apparatus as defined in claim 1, further including:
   a signal selection unit provided between said test signal generation unit and said filter, said signal selection unit for receiving the test signal and an input signal to be a processing target during normal operation, for selecting the test signal to be output during adjustment of a characteristic frequency of the filter, and for selecting the input signal to be output during normal operation of the filter.

6. A filter characteristic frequency adjusting apparatus comprising:
   a filter:
   a test signal generation unit for receiving a reference signal, and for generating a test signal having a frequency equal to a cutoff frequency characteristic of a low-pass type fourth-order Butterworth filter, which test signal is to be supplied to the filter when adjusting the frequency characteristic of the filter; and a control signal generation unit for receiving the test signal for generating (1) a control signal for controlling a characteristic frequency of the filter, and (2) a filter output signal obtained when the test signal is inputted into the low-pass type fourth-order Butterworth filter, wherein said control signal generation unit comprises:

a first comparator for comparing the predetermined filter output signal with a reference signal;

a second comparator for comparing an output signal from the phase shift unit with the reference signal;

a phase comparator for comparing the phases of binary signals that are respectively outputted from the first and second comparators.

7. A filter characteristic frequency adjusting method for controlling a cutoff frequency of a filter, said method comprising:

generating a test signal to be supplied to the filter when performing characteristic frequency adjustment for the filter;

shifting the phase of the test signal;

inputting the test signal into the filter, and outputting an ideal filter output signal from the filter, so that a predetermined phase difference is generated between the test signal and the predetermined filter output signal, based on a phase characteristic of the filter and a frequency of the test signal; and generating a control signal for controlling the cutoff frequency of the filter by using the predetermined filter output signal and the test signal that is phase-shifted, wherein said generating a control signal comprises:

comparing the predetermined filter output signal to a reference signal, using a first comparator;

comparing an output signal from the phase shift unit with the reference signal, using a second comparator; and comparing the phases of binary signals that are respectively outputted from the first and second comparators, using a phase comparator;

wherein said generating a control signal further comprises:

comparing the phase of the predetermined filter output signal with the phase of the test signal that is phase-shifted; and performing a binary search for a result of the comparison of phase of the predetermined filter output signal with the phase of the test signal that is phase-shifted, so as to generate the control signal.

* * * * *